US008373469B2

United States Patent
Kim et al.

(10) Patent No.: US 8,373,469 B2
(45) Date of Patent: Feb. 12, 2013

(54) PHASE-LOCKED LOOP BASED FREQUENCY SYNTHESIZER AND METHOD OF OPERATING THE SAME

(75) Inventors: Ki-Jin Kim, Gyeonggi-do (KR); Kwang Ho Ahn, Gyeonggi-do (KR)

(73) Assignee: Korea Electronics Technology Institute, Seongnam-si, Gyeonggi-do (KR)

( * ) Notice: Subject to any disclaimer, the term of this patent is extended or adjusted under 35 U.S.C. 154(b) by 0 days.

(21) Appl. No.: 12/981,619

(22) Filed: Dec. 30, 2010

(65) Prior Publication Data

US 2012/0074997 A1 Mar. 29, 2012

(30) Foreign Application Priority Data

Sep. 29, 2010 (KR) .................. 10-2010-0094526

(51) Int. Cl.
*H03L 7/06* (2006.01)
(52) U.S. Cl. ...................... 327/157; 327/148
(58) Field of Classification Search .......... 327/148, 327/157
See application file for complete search history.

(56) References Cited

U.S. PATENT DOCUMENTS

| 7,636,018 | B2 * | 12/2009 | Chang et al. | 331/12 |
| 7,973,606 | B2 * | 7/2011 | Kim et al. | 331/12 |
| 2008/0224789 | A1 * | 9/2008 | Chang et al. | 332/127 |
| 2010/0225361 | A1 * | 9/2010 | Rhee et al. | 327/105 |
| 2010/0329388 | A1 * | 12/2010 | Ko | 375/300 |
| 2012/0062292 | A1 * | 3/2012 | Sai | 327/157 |
| 2012/0074997 | A1 * | 3/2012 | Kim et al. | 327/157 |

FOREIGN PATENT DOCUMENTS

KR 10-0644816 11/2006

* cited by examiner

*Primary Examiner* — Adam Houston
(74) *Attorney, Agent, or Firm* — Lowe Hauptman Ham & Berner, LLP (57) ABSTRACT

A phase-locked loop based frequency synthesizer generates a plurality of output reference signals by phase-delaying an input reference signal and generates a plurality of comparison signals by using a signal having a frequency divided by the fractional frequency divider. Here, the comparison signals are lower than the divided frequency. Further, the phase-locked loop based frequency synthesizer controls an output frequency of a voltage controlled oscillator through phase and frequency comparison between the plurality of output reference signals and the plurality of comparison signals.

7 Claims, 9 Drawing Sheets

FIG. 1

Prior Art

PHASE-LOCKED LOOP BASED FREQUENCY SYNTHESIZER AND METHOD OF OPERATING THE SAME

CROSS-REFERENCE TO RELATED APPLICATION

This application claims priority to and the benefit of Korean Patent Application No. 10-2010-0094526 filed in the Korean Intellectual Property Office on Sep. 29, 2010, the entire contents of which are incorporated herein by reference.

BACKGROUND OF THE INVENTION (a) Field of the Invention

The present invention relates to a phase-locked loop based frequency synthesizer and a method of operating the same.

(b) Description of the Related Art

Frequency synthesizers are widely used in modern digital communications. A Phase Locked Loop (PLL) is used as means for implementing a frequency synthesizer at an RF output stage of a digital communication system.

Figure 1:
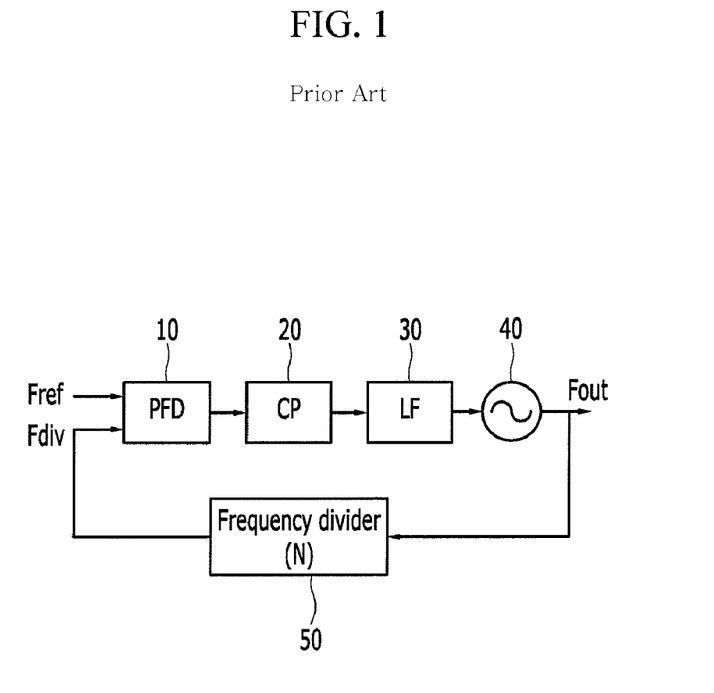
FIG. 1 is a view showing a conventional PLL-based frequency synthesizer.

FIG. 1 is a view showing a conventional PLL-based frequency synthesizer.

As shown in FIG. 1, the PLL-based frequency synthesizer includes a phase frequency detector (PFD) 10, a charge pump (CP) 20, a loop filter 30, a voltage controlled oscillator (VCO) 40, and a frequency divider 50.

The PFD 10 detects a phase difference and a frequency difference between a reference frequency Fref and a comparison frequency Fdiv, and outputs a corresponding pulse signal. The CP 20 generates a control current corresponding to a pulse signal output from the PFD 10 and outputs it to the LP 30. The LP 40 removes high frequency components from the control current, and outputs a control voltage proportional to the control current from the VCO 40. The VCO 40 outputs an output frequency Fout proportional to a control voltage output from the LP 40. The frequency divider 50 divides the output frequency Fout of the VCO 40 at a frequency division ratio N and feeds it back as a comparison frequency Fdiv to the PFD 10.

As a result of this negative feedback operation, the PLL-based frequency synthesizer operates such that the reference frequency and the same phase. Therefore, the output frequency Fout of the VCO 40 is expressed as Equation 1.

$$Fout = N * Fref \quad \text{[Equation 1]}$$

Where N is the frequency division rate of the frequency divider 50 (N is a positive integer).

Therefore, the PLL-based frequency synthesizer can obtain an output frequency Fout N times higher than the reference frequency Fref. Due to this reason, the output frequency Fout can be changed at N intervals. The PLL-based frequency synthesizer has to lower the reference frequency Fref in order to increase the resolution. However, once the reference frequency Fref is lowered, the cutoff frequency of the LP 40 needs to be lowered as well. As a result, the in-band noise increases, and the lock time increases.

To make up for this drawback of such an integer-N frequency synthesizer, fractional-N PLLs were suggested. Among the fractional-N PLLs, a fractional-N PLL using a sigma-delta modulator has a fractional frequency division ratio, rather than an integer frequency division ratio. Accordingly, the resolution of the frequency synthesizer can be increased without reducing the reference frequency Fref. Incidentally, a quantization noise generated by the sigma-delta modulator is a function of the operating frequency of the sigma-delta modulator, which resultantly functions to limit the cut-off frequency of the LP 40. In other words, if the cut-off frequency of the LP 40 is high, noise of the sigma-delta modulator is not filtered but transferred to the output frequency Fout, thereby degrading the overall phase noise characteristics.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a frequency synthesizer which can reduce phase noise.

An exemplary embodiment of the present invention provides a phase-locked loop based frequency synthesizer. The phase-locked loop based frequency synthesizer includes: a voltage controlled oscillator; a multi-signal generator, a fractional frequency divider; a pulse generator, a plurality of phase frequency detectors, a plurality of charge pumps; and a loop filter. The voltage controlled oscillator controls an output frequency by a control voltage. The multi-signal generator uses an input reference signal to generate a plurality of output reference signals having the same frequency as and a different phase from that of the input reference signal by the input reference signal. The fractional frequency divider divides the output frequency and outputs the same. The pulse generator uses a signal having a frequency divided by the fractional frequency divider to generate a plurality of comparison signals each having a comparison frequency lower than the divided frequency. The plurality of phase frequency detectors output a pulse signal according to differences in phase and frequency between the plurality of output reference signals and the comparison signals. The plurality of charge pumps generate a control current corresponding to the pulse signal of the phase frequency detectors. The loop filter generates the control voltage from the control current generated by the plurality of charge pumps and outputs the same to the voltage controlled oscillator.

Another exemplary embodiment of the present invention provides a method of operating a phase-locked loop based frequency synthesizer. The operating method includes: generating m output reference signals obtained by dividing one period of an input reference signal by m phases; fractionally dividing an output frequency of a voltage controlled oscillator according to the control of a sigma-delta modulator; separating a signal having the fractionally divided frequency into m comparison signals; generating m pulse signals according to the comparison in phase and frequency between the m output reference signals and the m comparison signals; generating a control voltage by the m pulse signals; and controlling the output frequency by the control voltage.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification and claims, unless explicitly described to the contrary, the word "comprise" and variations such as "comprises" or "comprising", will be understood to imply the inclusion of stated elements but not the exclusion of any other elements.

Now, a phase-locked loop based frequency synthesizer and a method of operating the same will be described in detail with reference to the drawings.

Figure 2:
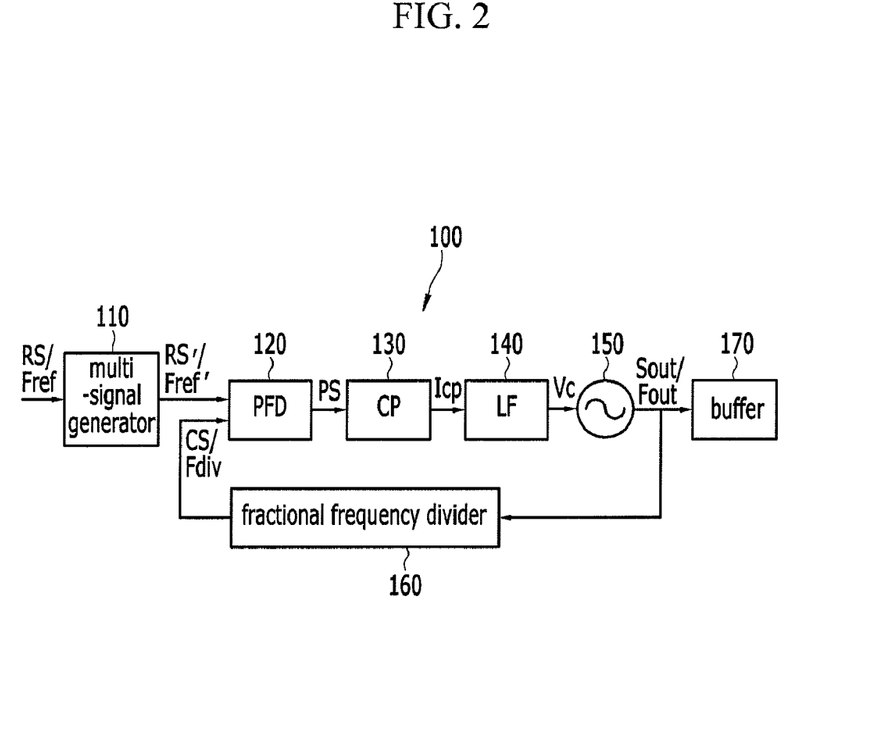
FIG. 2 is a view showing a PLL-based frequency synthesizer according to a first exemplary embodiment of the present invention.
Figure 3:
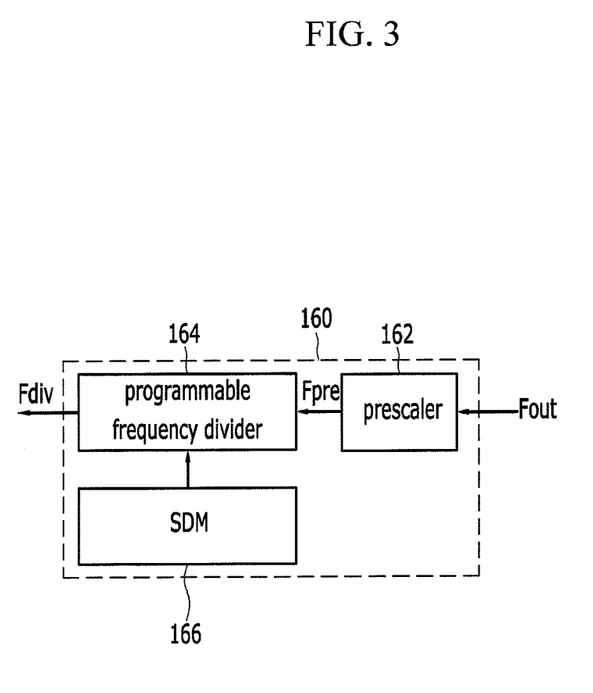
FIG. 3 is a schematic block diagram of a fractional frequency divider of FIG. 2.

FIG. 2 is a view showing a PLL-based frequency synthesizer according to a first exemplary embodiment of the present invention. FIG. 3 is a schematic block diagram of a fractional frequency divider of FIG. 2.

Referring to FIG. 2, a phase-locked loop (PLL)-based frequency synthesizer 100 comprises a multi-signal generator 110, a phase frequency detector (PFD) 120, a charge pump (CP) 130, a loop filter (LF) 140, a voltage controlled oscillator (VCO) 150, a fractional frequency divider 160, and a buffer 170.

The multi-signal generator 110 generates an output reference signal RS' using an input reference signal RS, and outputs the output reference signal RS' to the PFD 120. The input reference signal RS may be a clock signal having a period. A reference frequency Fref of the output reference signal RS' is set higher than a reference frequency Fref of the input reference signal RS.

The PFD 120 detects a phase difference and a frequency difference between the output reference signal RS' and a comparison signal CS, and outputs a pulse signal PS corresponding to the phase difference and the frequency difference to the CP 130. The pulse signal PS may be, for example, a signal which can be on either UP or DOWN according to the phase difference and the frequency difference. That is, if the phase of the reference frequency Fref of the output reference signal RS' is faster than that of a comparison frequency Fdiv of the comparison signal CS, an UP signal is generated. This is to increase an output frequency Fout of an oscillation signal Sout of the VCO 150 because the output frequency Fout of the oscillation signal Sout operates slower than the reference frequency Fref. On the contrary, if the phase of the comparative frequency Fdiv of the comparison signal CS is faster than that of the reference frequency Fref of the reference signal RS', a DOWN signal is generated.

The CP 130 outputs a control current Icp corresponding to the pulse signal PS to the LF 140.

The LF 140, which is a kind of low pass filter (LPF), generates a control voltage Vc using the control current Icp, and outputs a control voltage Vc to the VCO 150.

The LF 140 may comprise a plurality of capacitors (not shown) connected in parallel.

That is, when a positive pulse signal PS is input, the CP 130 outputs a current proportional to the pulse width to the capacitors of the LF 140 to accumulate more electric charges in the capacitors. Then, the control voltage Vc increases. On the contrary, when a negative pulse signal PS is input, the CP 130 decreases the electric charges accumulated in the capacitors of the LF 140 by the current proportional to the pulse width. Then, the control voltage VC decreases as well.

The VCO 150 generates an output frequency Fout proportional to the control voltage Vc, and outputs an oscillation signal Sout of the output frequency Fout. At this point, a differential signal as the oscillation signal Sout may be output.

The fractional frequency divider 160 receives as feedback the oscillation signal Sout of the VOC 150, and fractionally divides the output frequency Fout of the oscillation signal Sout and outputs it to the PFD 120.

The buffer 170 stores the oscillation signal Sout of the VOC 150, and is able to obtain the frequency and the jitter characteristics using the stored oscillation signal Sout of the VOC 150.

Referring to FIG. 3, the fractional frequency divider 160 comprises a prescaler 162, a programmable frequency divider 164, a sigma-delta modulator (SDM) 166.

The prescaler 162 receives as feedback the oscillation signal Sout of the VCO 150, and divides the output frequency Fout of the oscillation signal Sout at a set frequency division ratio. That is, if the output frequency Fout of the oscillation signal Sout is high, it is difficult for the program divider 164 to perform frequency division. Thus, the prescaler 162 divides the output frequency Fout of the oscillation signal Sout at ½, ⅓, etc. in advance to lower the output frequency Fout of the oscillation signal Sout.

The programmable frequency divider 164 has a frequency division ratio which varies with an output bit signal of the SDM 630, and divides the frequency Fpre divided by the prescaler 162 at a variable frequency division ratio and outputs it to the PFD 120.

The SDM 166 adjusts the frequency division ratio of the programmable frequency divider 164. That is, an output bit signal for varying the frequency division ratio of the programmable frequency divider 164 is output to the programmable frequency divider 164.

For example, the SDM 166 may output an output bit signal "0" or "1", and the programmable frequency divider 164 having received the output bit signal "0" may divide the frequency Fprep at a frequency division ratio of N, and the programmable frequency divider 164 having received the output bit signal "1" may divide the frequency Fprep at a frequency division ratio of (N+1). By doing so, fractional frequency division is enabled.

When the ratio of (N+1) frequency division is denoted by Nfrc, the output frequency Fout of the VCO 150 can be expressed as Equation 2.

$$Fref = Fout/(N+Nfrc)$$

$$Fout = (N+Nfrc)*Fref \qquad \text{[Equation 2]}$$

where N is an integer and 0=Nfrc=1.

As above, the resolution of the PLL-based frequency synthesizer 100 can be increased by using the fractional frequency divider 160.

As the SDM 166 high-pass filters a high frequency quantization noise, the LF 140 removes the high-pass filtered noise. Due to the high frequency quantization noise of the SDM 166, there is a limitation in increasing the loop bandwidth of the LF 140.

Incidentally, as in the first exemplary embodiment of the present invention, if the reference frequency Fref' of the reference signal RS' is increased by using the multi-signal generator 110, this leads to the effect of making faster the operating speed of the SDM 630. Thus, the high frequency quantization noise can be relatively reduced.

That is, in the PLL-based frequency synthesizer 100, the SDM 166 resultantly operates in synchronization with the reference frequency Fref' of the reference signal RS'. Hence, by increasing the reference frequency Fref' of the reference signal RS', the operating speed of the SDM 166 increases, and accordingly the high frequency quantization noise decreases.

As such, the cut-off frequency of the LP 140 can be set high, and the loop bandwidth of the LF 140 can be increased. Moreover, the lock time can be reduced by increasing the loop bandwidth because the lock time is inversely proportional to the cut-off frequency of the LP 140.

In addition, the overall loop operates at a relatively low frequency division ratio N, thus reducing the in-band phase noise which is proportional to a frequency division ratio.

However, although the increased reference frequency Fref' of the reference signal RS' may cause the high frequency quantization noise of the SDM 630 to be reduced, it may increase the comparison frequency Fdiv, thus increasing the noise of the PFD 120. Accordingly, an exemplary embodiment for reducing the noise of the PFD 120 will be described in greater details with reference to FIGS. 4 to 9.

Figure 4:
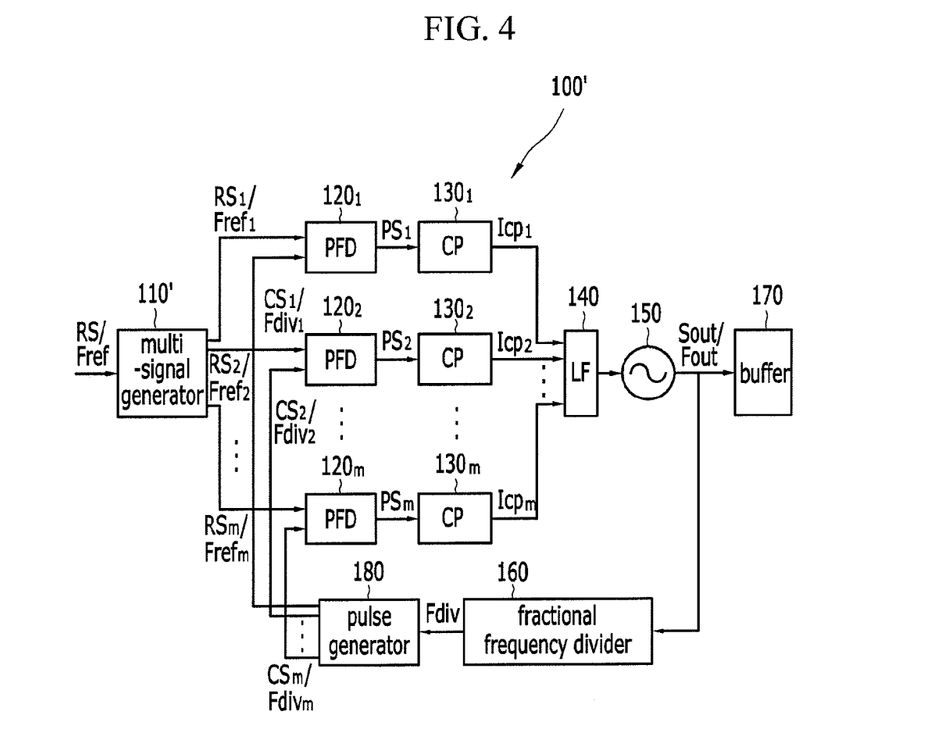
FIG. 4 is a view showing a PLL-based frequency synthesizer according to a second exemplary embodiment of the present invention.
Figure 5:
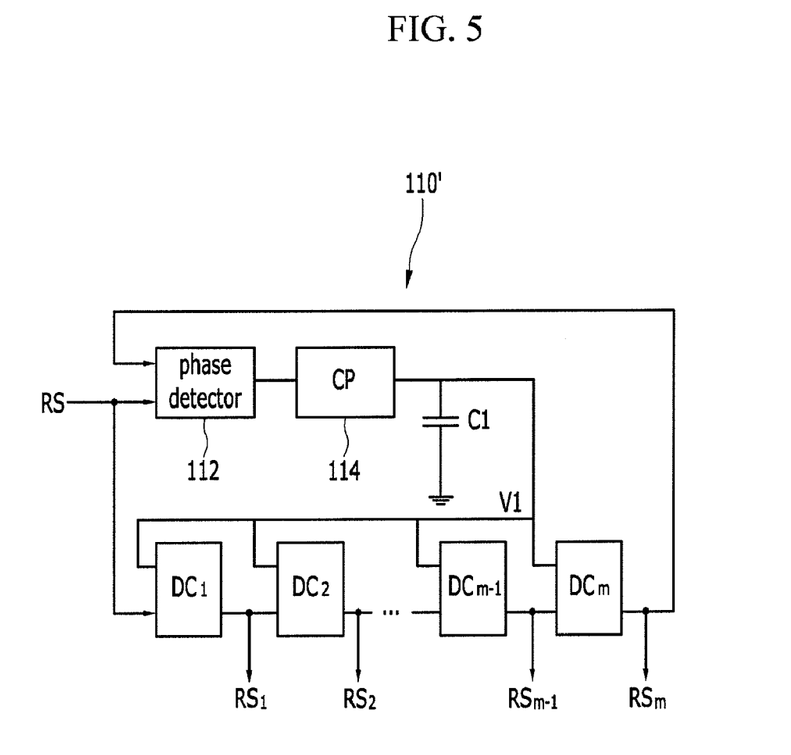
FIG. 5 is a view showing a multi-signal generator according to an exemplary embodiment of the present invention.
Figure 6:
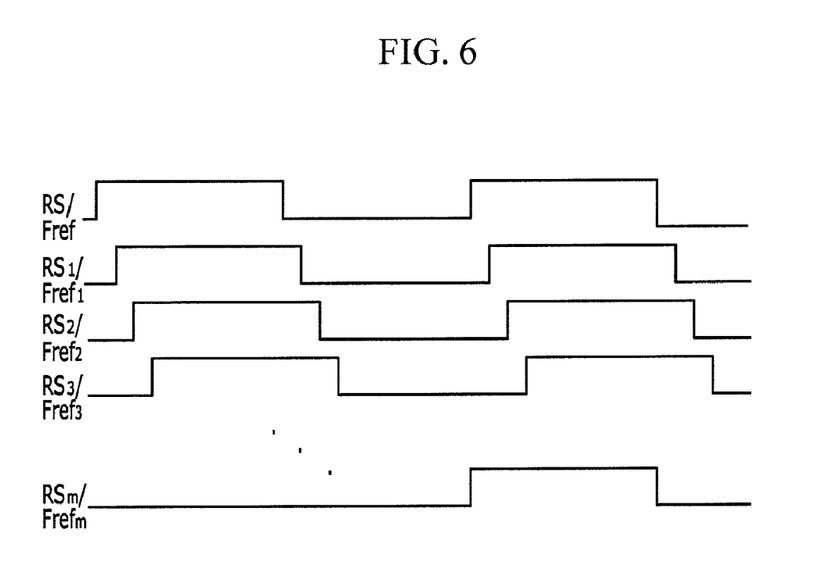
FIG. 6 is a view showing an output reference signal of the multi-signal generator shown in FIG. 4.
Figure 7:
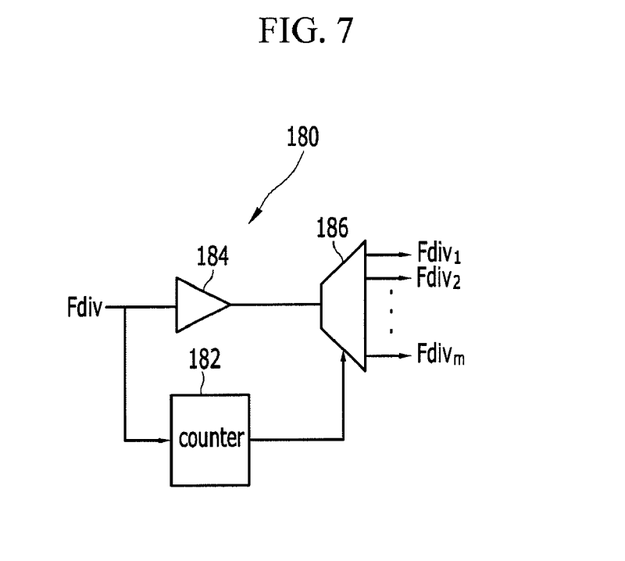
FIG. 7 is a view showing one example of a pulse generator according to an exemplary embodiment of the present invention.
Figure 8:
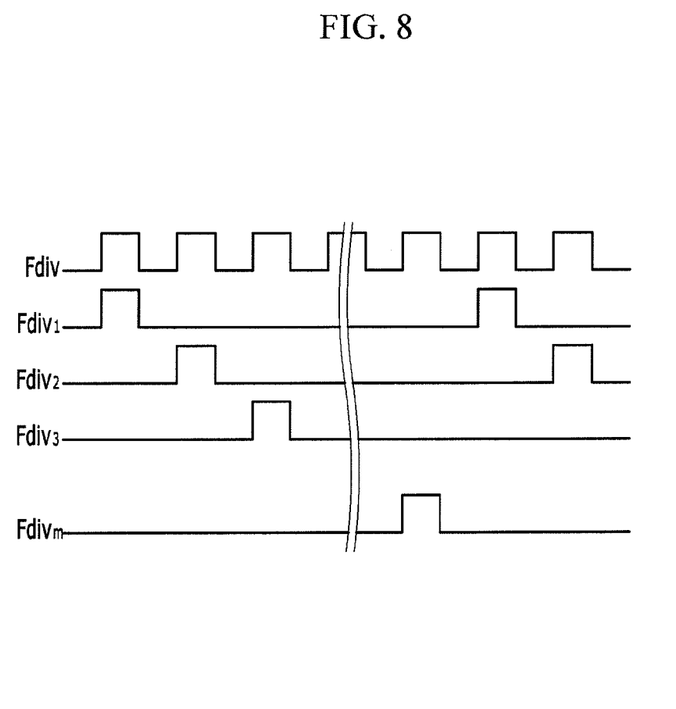
FIG. 8 is a view showing an output signal of the pulse generator shown in FIG. 4.
Figure 9:
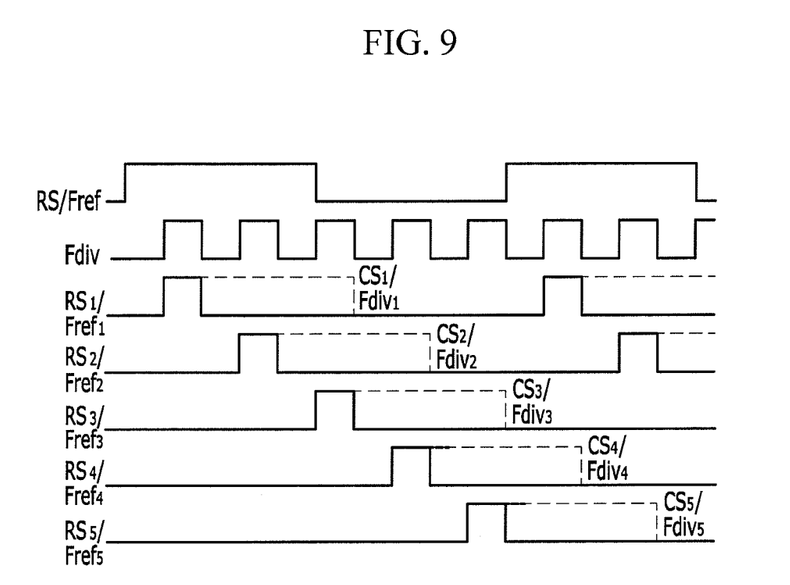
FIG. 9 is a view showing a phase locked state in the PFD of FIG. 4.

FIG. 4 is a view showing a PLL-based frequency synthesizer according to a second exemplary embodiment of the present invention. FIG. 5 is a view showing a multi-signal generator according to an exemplary embodiment of the present invention. FIG. 6 is a view showing an output reference signal of the multi-signal generator shown in FIG. 4. Moreover, FIG. 7 is a view showing one example of a pulse generator according to an exemplary embodiment of the present invention. FIG. 8 is a view showing an output signal of the pulse generator shown in FIG. 4. FIG. 9 is a view showing a phase locked state in the PFD of FIG. 4.

Referring to FIG. 4, the PLL-based frequency synthesizer 100' comprises a multi-signal generator 110', a plurality of PFDS $120_1$ to $120_m$, a plurality of CPs $130_1$ to $130_m$, an LF 140, a VCO 150, a fractional frequency divider 160, a buffer 170, and a pulse generator 180.

The multi-signal generator 110' delays the phase of the input reference signal RS to generate m output reference signals $RS_1$ to $RS_m$, and outputs the output reference signals $RS_1$ to $RS_m$ to the corresponding PFD $120_1$ to $120_m$. At this point, by adding together the m output reference signals $RS_1$ to $RS_m$, the output reference signal RS' of FIG. 1 can be generated.

Referring to FIG. 5, a delay lock loop may be used as the multi-signal generator 110'.

The delay lock loop comprises a phase detector 112, a CP 114, a capacitor C1, and a plurality of delay cells $DC_1$ to $DC_m$.

The plurality of delay cells $DC_1$ to $DC_m$ are sequentially connected. That is, an output signal of the delay cell $DC_1$ positioned at the front end is input as an input signal to the delay cell positioned at the rear end. At this point, a reference signal RS may be input into the delay cell $DC_1$ positioned at the foremost end among the plurality of delay cells $DC_1$ to $DC_m$.

Also, an output reference signal $RS_m$ of the reference signal $DC_m$ positioned at the last end among the plurality of delay cells $DC_1$ to $DC_m$ is input into the phase detector 112.

The plurality of delay cells $DC_1$ to $DC_m$ are configured to delay an input signal by a value equal to 1/m of one period of the reference signal RS and output it.

Then, the phase detector 112 compares the phase of the output reference signal $RS_m$ of the delay cell $DC_m$ positioned at the last end with the phase of the reference signal RS to output a pulse signal, and the CP 114 outputs a current corresponding to a pulse signal to the capacitor C1 and changes or discharges the capacitor C1. The voltage of the charged or discharged capacitor C1 is input into the plurality of delay cells $DC_1$ to $DC_m$, and the plurality of delay cells $DC_1$ to $DC_m$ delay an input signal by a value equal to 1/m of one period of the reference signal RS and output it, and controls the output reference signals $RS_1$ to $RS_m$ in accordance with the voltage V1 of the capacitor C1.

When the phase of the output signal $RS_m$ of the delay cell $DC_m$ positioned at the last end and the phase of the input reference signal RS are locked, the output reference signals $RS_1$ to $RS_m$ of the plurality of delay cells $DC_1$ to $DC_m$ are represented as signals obtained by dividing one period of the input reference signal RS by m phases as shown in FIG. 6.

Incidentally, the added reference signals $RS_1$ to $RS_m$ of the plurality of delay cells $DC_1$ to $DC_m$ may be used as an output reference signal RS' output from the multi-signal generator (110 of FIG. 2).

Referring again to FIG. 4, the pulse generator 180 generates comparison signals $CS_1$ to $CS_m$ for comparison with the output reference signals $RS_1$ to $RS_m$ using a signal having a frequency Fdiv divided by the fractional frequency divider 160, and outputs them to the PFDs $120_1$ to $120_m$. The comparison signals $CS_1$ to $CS_m$ may be as shown in FIG. 7.

That is, the pulse generator 180 generates pulse signals $CS_1$ to $CS_m$ having divided frequencies $Fdiv_1$ to $Fdiv_m$ each equal to 1/m of the divided frequency Fdiv in synchronization with a rising edge of the divided frequency Fdiv, and outputs them to the corresponding $120_1$ to $120_m$.

In one example of the pulse generator 180, referring to FIG. 8, the pulse generator 180 comprises a counter 182, a delay device 184, and a demultiplexer 186.

The counter 182 generates an output control signal based on the signal having the divided frequency Fdiv to control the output of the demultiplexer 186.

The delay device 184 functions to delay the signal having the divided frequency Fdiv. That is, the delay device 184 is used for synchronization with an output control signal of the counter 182.

The demultiplexer 186 has m output terminals, and separates the signal of the divided frequency Fdiv transferred through the delay device 184 into m signals each having a frequency Fdiv/m in response to the output control signal of the counter 182 and outputs them to the corresponding output terminals.

Referring again to FIG. 4, the PFDs $120_1$ to $120_m$ receive reference signals $RS_1$ to $RS_m$ and comparison signals $CS_1$ to $CS_m$ and detect a phase difference and frequency difference, and output pulse signals $PS_1$ to $PS_m$ corresponding to the phase difference and the frequency difference to the CPs $130_1$ to $130_m$.

The CPs $130_1$ to $130_m$ generate control currents $Icp_1$ to $Icp_m$ from the pulse signals $PS_1$ to $PS_m$ of the corresponding PFDS $120_1$ to $120_m$ and output them to the LF 140.

The LF 140 generates a control voltage Vc using the control currents $Icp_1$ to $Icp_m$, and outputs the control voltage Vc to the VCO 150.

As described above, noise of the PFDs 120₁ to 120ₘ can be reduced compared to the first exemplary embodiment because the frequencies $Fdiv_1$ to $Fdiv_m$ of the pulse signals $CS_1$ to $CS_m$ are each equal to 1/m of the divided frequency.

Moreover, because the operating frequency of the SDM 166 becomes m times faster, high frequency quantization noise caused by the SDM 166 can be reduced. Consequently, the cut-off frequency of the LF 140 can be increased, thus improving the in-band phase noise.

With the PLL-based frequency synthesizer 100' of this type according to the second exemplary embodiment of the present invention, the output frequency Fout of the oscillation signal Sout of the VCO 150 can be stabilized as the pulse signals $CS_1$ to $CS_m$ and the reference signals $RS_1$ to $RS_m$ pass through the PFDs 120₁ to 120ₘ, the CPs 130₁ to 130ₘ, and the LF 400. That is, as shown in FIG. 9, the output frequency Fout of the oscillation signal Sout of the VCO 150 can be stabilized as the loop is repeated until the phases of the pulse signals $CS_1$ to $CS_m$ and of the reference signals $RS_1$ to $RS_m$ are locked by the PFDs 120₁ to 120ₘ.

According to an exemplary embodiment of the present invention, phase noise generated from an abnormal frequency detector can be reduced by using a phase frequency detector having a low operating speed, and high frequency quantization noise can be reduced by using a sigma-delta modulator capable of high speed operation.

As a consequence, the cut-off frequency of a loop filter can be set high by reducing the high frequency quantization noise of the sigma-delta modulator, and, accordingly, the in-band phase noise and the lock time can be reduced.

The exemplary embodiments of the present invention are not implemented only by a device and/or method, but can be implemented through a program for realizing functions corresponding to the configuration of the exemplary embodiments of the present invention and a recording medium having the program recorded thereon. These implementations can be realized by the ordinarily skilled person in the art from the description of the above-described exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A phase-locked loop based frequency synthesizer comprising:
    a voltage controlled oscillator for controlling an output frequency by a control voltage;
    a multi-signal generator that uses an input reference signal to generate a plurality of output reference signals having the same frequency as and a different phase from that of the input reference signal by the input reference signal;
    a fractional frequency divider for dividing the output frequency and outputting the same;
    a pulse generator that uses a signal having a frequency divided by the fractional frequency divider to generate a plurality of comparison signals each having a comparison frequency lower than the divided frequency;
    a plurality of phase frequency detectors for outputting a pulse signal according to differences in phase and frequency between the plurality of output reference signals and the comparison signals;
    a plurality of charge pumps for generating a control current corresponding to the pulse signal of the phase frequency detectors; and
    a loop filter for generating the control voltage from the control current generated by the plurality of charge pumps and outputting the same to the voltage controlled oscillator,
    wherein the plurality of output reference signals respectively corresponds to a plurality of signals obtained by dividing one period of the input reference signal by a plurality of phases.

2. The phase-locked loop based frequency synthesizer of claim 1,
    wherein the multi-signal generator comprises a delay lock loop.

3. The phase-locked loop based frequency synthesizer of claim 1,
    wherein the comparison frequency corresponds to a value obtained by dividing 10 the divided frequency by m, where m is the number of the comparison signals.

4. The phase-locked loop based frequency synthesizer of claim 3,
    wherein the pulse generator has a counter for generating an output control signal based on the signal having the divided frequency and m output terminals, and separates the signal having the divided frequency into m comparison signals having comparison frequencies according to the output control signal and outputs the comparison signals through the m output terminals.

5. The phase-locked loop based frequency synthesizer of claim 3,
    wherein the fractional frequency divider comprises:
    a prescaler for dividing the output frequency at a first frequency division ratio;
    a programmable frequency divider for dividing the frequency divided by the first frequency divider by a second frequency divider or third frequency divider and outputting the same according to an output bit signal; and
    a sigma-delta modulator for outputting the output bit signal by the programmable frequency divider.

6. A method of operating a phase-locked loop based frequency synthesizer, the method comprising:
    fractionally dividing an output frequency of a voltage controlled oscillator according to the control of a sigma-delta modulator;
    separating a signal having the fractionally divided frequency into m comparison signals;
    generating m pulse signals according to the comparison in phase and 15 frequency between the m output reference signals and the m comparison signals;
    generating a control voltage by the m pulse signals; and
    controlling the output frequency by the control voltage,
    wherein the plurality of output reference signals respectively corresponds to a plurality of signals obtained by dividing one period of the input reference signal by a plurality of phases.

7. The method of claim 6, wherein the comparison frequency of each of the comparison signals corresponds to a value obtained by dividing the divided frequency by m.

* * * * *